(12) United States Patent
Gnai

(10) Patent No.: US 8,390,378 B2
(45) Date of Patent: Mar. 5, 2013

(54) METHOD AND APPARATUS FOR BROADBAND INPUT MATCHING WITH NOISE AND NON-LINEARITY CANCELLATION IN POWER AMPLIFIERS

(75) Inventor: Wai Lim Gnai, Poway, CA (US)

(73) Assignee: Entropic Communications, Inc., San Diego, CA (US)

( * ) Notice: Subject to any disclaimer, the term of this patent is extended or adjusted under 35 U.S.C. 154(b) by 0 days.

(21) Appl. No.: 13/171,257

(22) Filed: Jun. 28, 2011

(65) Prior Publication Data
US 2012/0013404 A1  Jan. 19, 2012

Related U.S. Application Data

(60) Provisional application No. 61/363,829, filed on Jul. 13, 2010.

(51) Int. Cl.
*H03F 3/45* (2006.01)
(52) U.S. Cl. ...................................................... 330/253
(58) Field of Classification Search .................. 330/253, 330/254, 260
See application file for complete search history.

(56) References Cited

U.S. PATENT DOCUMENTS

| | | | | |
|---|---|---|---|---|
| 5,463,347 | A | * | 10/1995 | Jones et al. ................... 330/253 |
| 6,111,463 | A | | 8/2000 | Kimura |
| 7,064,609 | B1 | | 6/2006 | Beck et al. |
| 7,078,970 | B2 | | 7/2006 | Ruck |
| 7,633,345 | B2 | * | 12/2009 | Zhan ............................. 330/302 |
| 7,728,668 | B2 | | 6/2010 | Okanobu |
| 2005/0270098 | A1 | * | 12/2005 | Zhang et al. .................. 330/253 |
| 2009/0108943 | A1 | | 4/2009 | Kuo et al. |

OTHER PUBLICATIONS

International Search Report and Written Opinion of the ISA, Application No. PCT/US2011/042546—pp. 1-6.

* cited by examiner

*Primary Examiner* — Khanh V Nguyen
(74) *Attorney, Agent, or Firm* — Bruce Greenhaus; Sheppard, Mullin, Richter & Hampton LLP

(57) ABSTRACT

A CMOS differential power amplifier having broadband input matching with Noise and Non-linearity Cancellation. The broadband input match is realized by using two "Diode-Connected" NFETs (i.e., N-type Field Effect Transistors). Resulting noise degradation is reduced by using a noise cancellation structure. By using the same structure the disclosed method and apparatus also achieves non-linearity cancellation.

1 Claim, 7 Drawing Sheets

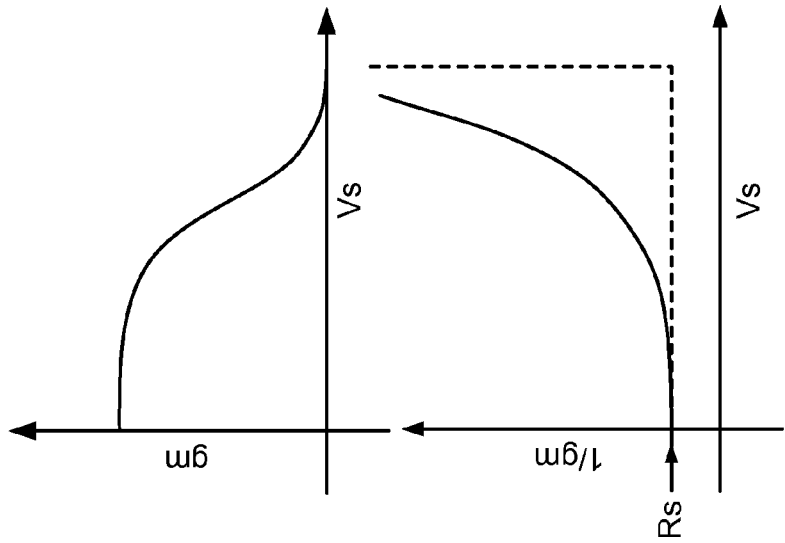
FIG. 3
FIG. 4
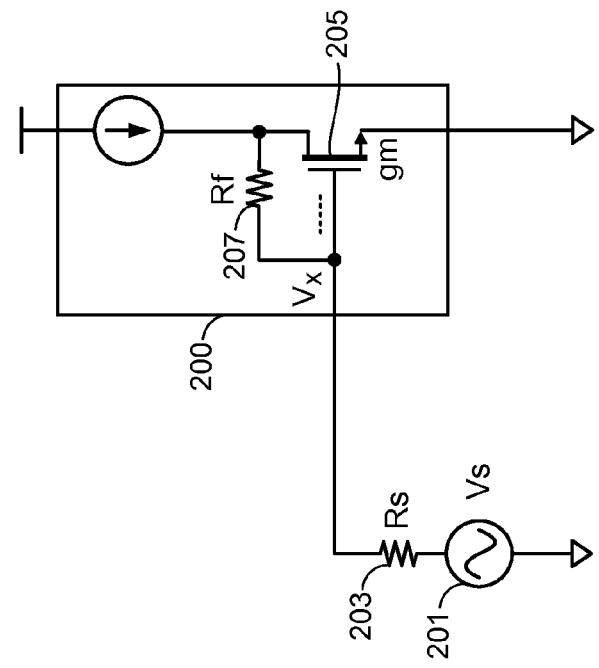
FIG. 2

METHOD AND APPARATUS FOR BROADBAND INPUT MATCHING WITH NOISE AND NON-LINEARITY CANCELLATION IN POWER AMPLIFIERS

CROSS-REFERENCE TO RELATED APPLICATIONS

This application claims the benefit to U.S. Provisional Application No. 61/363,829 filed Jul. 13, 2010, which is herein incorporated by reference in its entirety.

TECHNICAL FIELD

The disclosed method and apparatus relates to architecture of amplifiers, and more particularly, some embodiments relate to input impedance matching in amplifiers.

DESCRIPTION OF THE RELATED ART

Designers of integrated circuits (ICs) face several challenges today.

SUMMARY OF DISCLOSED METHOD AND APPARATUS

The disclosed method and apparatus is a CMOS differential power amplifier having broadband input matching with Noise and Non-linearity Cancellation. The broadband input match is realized by using 2 "Diode-Connected" NFETs (i.e., N-type Field Effect Transistors). However, using diode-connected-NFETs for matching degrades noise performance (in terms of noise figure). Such noise degradation is reduced (and in some embodiments canceled) by using a noise cancellation structure. By using the same structure the disclosed method and apparatus also achieves non-linearity cancellation. This enables the disclosed method and apparatus to achieve broadband input matching, a low noise figure and enables the fabrication of a high linearity amplifier.

The following presents a simplified summary of one or more embodiments in order to provide a basic understanding of some aspects of such embodiments. This summary is not an extensive overview of the one or more embodiments, and is intended to neither identify key or critical elements of the embodiments nor delineate the scope of such embodiments. Its sole purpose is to present some concepts of the described embodiments in a simplified form as a prelude to the more detailed description that is presented later.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

FIG. 2 shows a broadband matching device used to perform pre-distortion.

FIG. 3 shows the transconductance of a transistor used in a broadband matching device over different differential input voltage swings ($V_s$ on X-axis).

FIG. 4 shows the input resistance ($1/g_m$) of the broadband matching device of FIG. 2.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 1:
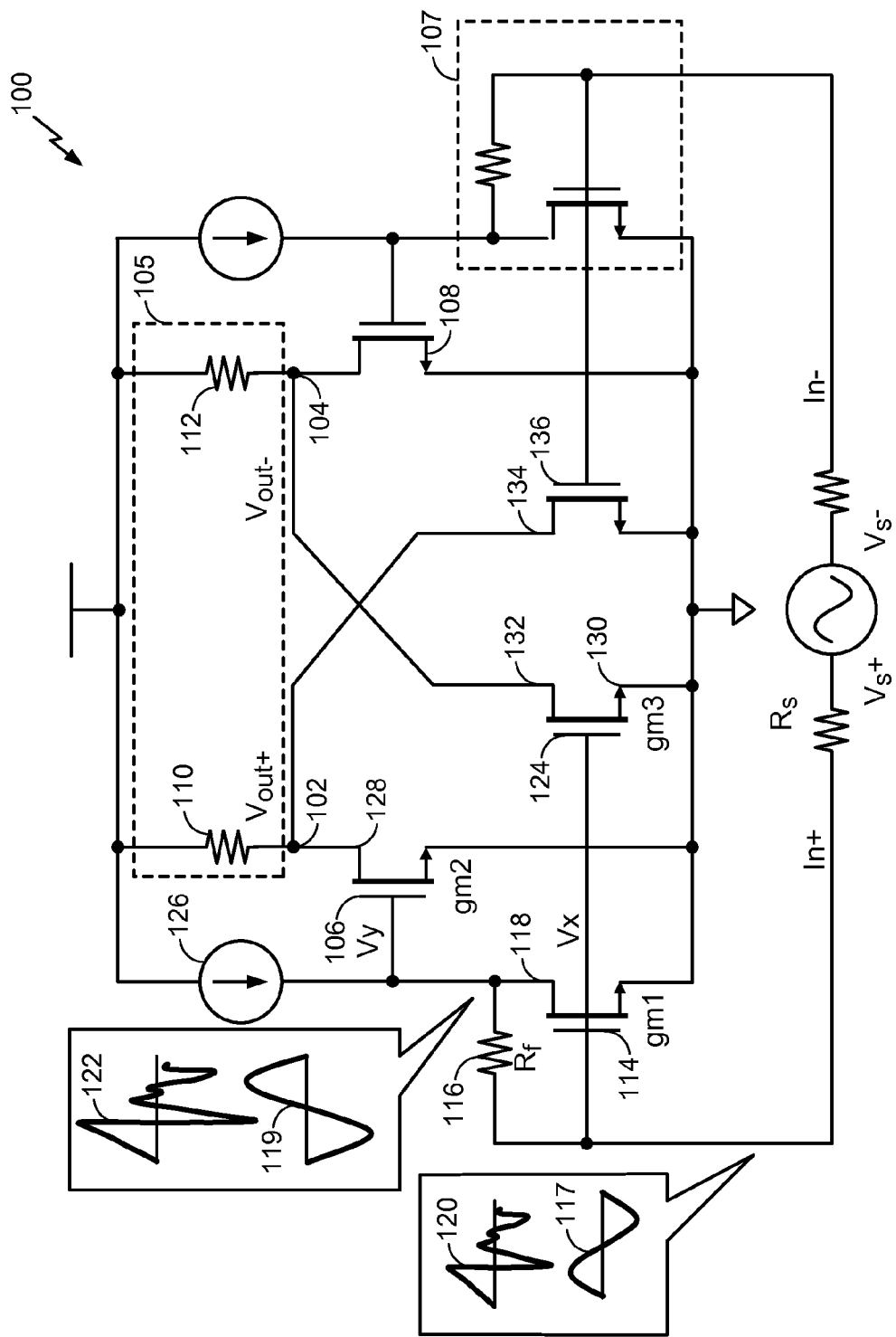
FIG. 1 shows an architecture that achieves noise cancellation.

FIG. 1 shows an architecture 100 that achieves noise cancellation and improves linearity. Initially, the noise cancellation feature of the architecture 100 will be explained.

In one embodiment of the disclosed method and apparatus, a constant current source 126 provides a bias current to a diode-connected transistor (such as an FET) 114 to create a broadband matching device. The input resistance of the broadband matching device is equal to "$1/g_{m1}$" of the FET 114, where $g_{m1}$ is the transconductance of the FET 114. Transconductance is the ratio of the current change at the output port to the voltage change at the input port. A resistor 116 having resistance $R_f$ is connected between the gate and drain of the FET 114 to "diode-connect" the FET 114. The positive output of a differential signal source $V_s$+ is coupled to the gate of the FET 114. The negative output of the differential signal source Vs− is coupled to a similar broadband matching device 107 on the negative leg of the architecture 100.

The two broadband matching devices are coupled to a cross-coupled differential amplifier section. The amplifier section comprises four transistors 106, 108, 124, 136. Differential outputs 102, 104 are provided from two of the transistors 106, 108. In one embodiment, the transistors 106, 108 are field effect transistors (FETs). For the sake of simplicity in explaining the operation of the disclosed method and apparatus, the outputs 102, 104 are shown connected to a load structure 105 that has two load resistors 110, 112. In reality, the load can be any kind of circuit that allows the combined current to pass through. In particular, the load resistance 110, 112 can be provided by a common gate/base device which forms a differential cascode structure (as shown below in more detail in FIG. 9).

The gate of the FET 106 is coupled to the drain 118 of the FET 114. The source of the FET 106 is coupled to the source of the FET 114. The drain 128 of the FET 106 is coupled to one end of the load resistor 110. The other end of the load resistor 110 is coupled to a power source (such as a voltage source). The gate of a third FET 124 is coupled to the gate of the FET 114. The source 130 of the FET 124 is coupled to the source of the FETs 114 and 106. The drain 132 of the FET 124 is coupled to one side of the load resistor 112 that resides on the negative leg of the differential circuit. The negative leg of the differential circuit is identical to the positive leg, with the drain 134 of a FET 136 coupled to the positive resistor 110 and the drain 128 of the FET 106.

A positive signal source $V_s+$ applies a signal 117 to the gate of the FET 114 is illustrated in FIG. 1. The input resistance of the circuit (i.e., the resistance looking into the gate of the FET 114) is equal to "$1/g_{m1}$" of the FET 114, where $g_{m1}$ is the transconductance of the FET 114. Transconductance is the ratio of the current change at the output port to the voltage change at the input port. In this circuit, the single-ended voltage gain $V_x/V_s$ at the drain 118 of the FET 114 is given by $1-(g_{m1}*R_f)$. Accordingly, when $g_{m1}*R_f$ is larger than 1, the voltage gain $V_x/V_s$ at the output of the FET 114 will be negative. A negative voltage gain means that the signal $V_x$ is 180 degrees out of phase with the input signal $V_s$. Accordingly, it can be seen that the input and output signals will be out of phase when $g_{m1}$ is large. In turn, $g_{m1}$ is large when the input signal is relatively small (i.e., when the swing of the input $V_s$ is relatively small). The voltage waveform 119 that appears at the drain of the FET 114 and the gate of the FET 106 is illustrated in FIG. 1. The waveform 119 at the drain 118 of the FET 114 is scaled and inverted by the negative gain of the FET 114.

On the other hand, the noise 122 that appears at the drain 118 of the FET 114 is channel noise created within the FET 114. The noise 120 at the gate of the FET 114 is a divided-down version of noise 122. Therefore, the noise 120 is in-phase with noise 122 and has a magnitude scaled down by a factor of $R_s/(R_s+R_f)$.

The noise from the FET 114 is fed to the gate of the FET 124. The FET 124 scales the noise so that the amount of noise that appears at the output 102 of the FET 106 is the same as the amount and phase as the noise that appears at the output 104 of the FET 108 in the other differential leg of the circuit. Therefore, the noise will appear as common mode noise at the two outputs 102, 104. Accordingly, the circuit cancels out any noise from FET 114, yet combines the signal constructively at the differential outputs 102, 104.

The disclosed method and apparatus uses the very same broadband matching device with the noise canceling structure described in FIG. 1 to perform non-linearity cancellation. Accordingly, both benefits are combined in a single circuit topology.

FIG. 2 is an illustration of a broadband matching device 200. The concept of using the same broadband matching device 200 (i.e., a diode connected FET 205) to perform "pre-distortion" will now be explained. Pre-distortion is used to offset non-linear distortion that would otherwise appear at the output of an amplifier. For illustrative purposes, a driving stage 201 with source impedance ($R_s$) 203 is shown connected to the broadband matching device 200 (diode-connected FET 205 with a resistor 207 having a value $R_f$). The input impedance ($R_{in}$) looking into the gate of the FET 205 is "$1/g_m$", where $g_m$ is the transconductance of the FET 205. At small signal (i.e., when the swing of the input signal is relatively small), the input impedance $R_{in}$ which is equals to $1/g_m$ at small signal swing is designed to be equal to $R_s$ for input matching. The linearity (or non-linearity) of the input (i.e., the linearity of the transconductance $g_m$) can be controlled by "starving" the biasing current $I_{bias}$ to the diode-connected transistor 205 (i.e., using a relatively low biasing current $I_{bias}$. That is, using a low biasing current $I_{bias}$, allows a non-linear $g_m$ to be provided. FIG. 3 shows the relationship of $g_m$ to $V_s$.

When the signal swing ($V_s$) of the driving stage 201 increases with a limited bias current flowing through the drain of the FET 205, $g_m$ decreases. The decrease in $g_m$ causes the input impedance $R_{in}$, to increase (i.e., $R_{in}=1/g_m$). An increase in $R_{in}$ means that more of the voltage of the source $V_s$ will be dropped across $R_{in}$, $V_s$, $V_x$, $V_s$, $R_s$, and $R_{in}$, are related by the following equation:

$$V_x=V_s(R_{in})/(R_s+R_{in}) \text{ (i.e., voltage divider)}$$

From the voltage divider effect, more of the source voltage will appear across the input of the FET 205 as $g_m$ decreases with increasing input swing. FIG. 4 shows the relationship between $1/g_m$ (i.e., $R_{in}$) and V. Therefore, $V_x$ will increase as the swing of $V_s$ increases due to the fact that the resistance in $R_{in}$, will increase by virtue of the decrease in $g_m$, the gain will also increase (i.e., a "gain-expansion" is created). This gain-expanded input signal will cancel out the natural gain-compression property of an amplifier with which the broadband matching device is used. Accordingly, non-linearity cancellation is achieved.

Figure 5:
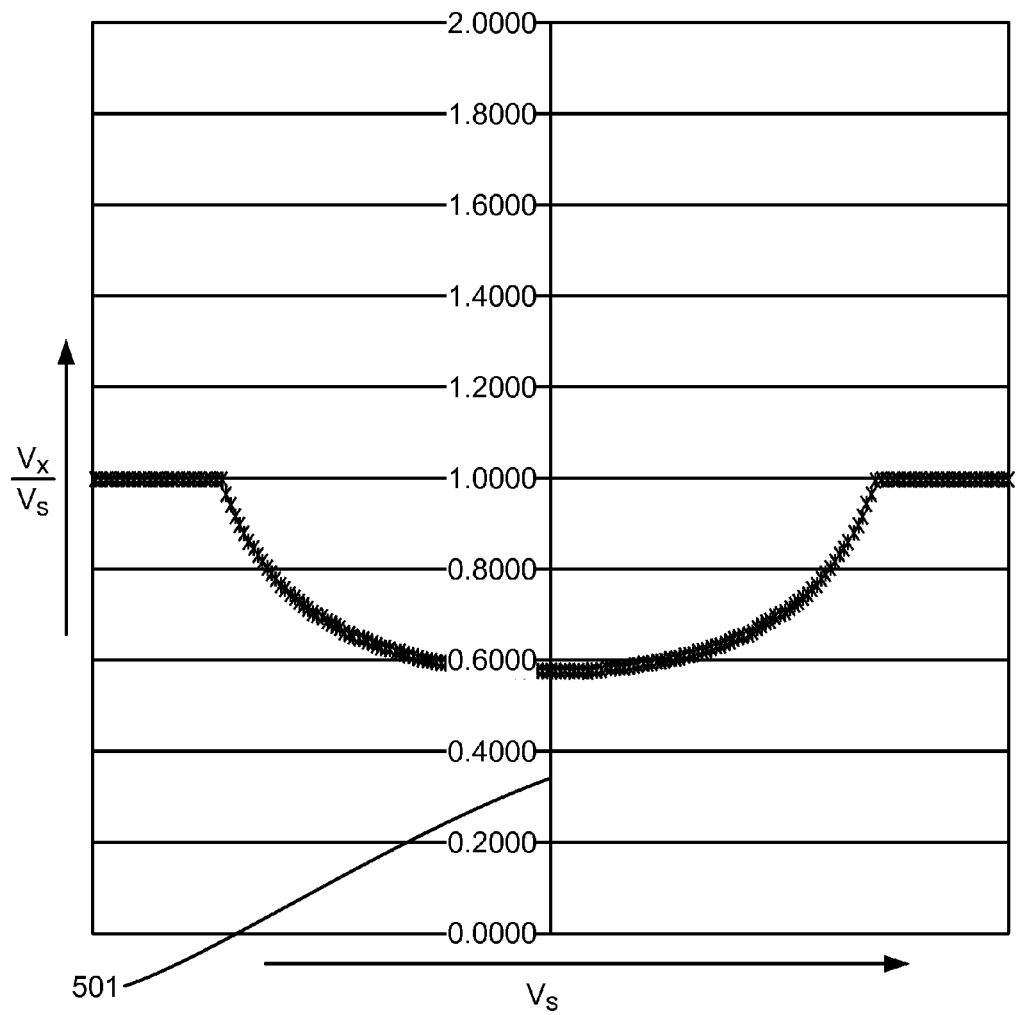
FIG. 5 shows gain expansion as a function of the input voltage $V_s$ swing.

It can be seen that this gain expansion property provided by the input matching device 200 provides non-linearity cancellation. FIG. 5 shows the relationship of $V_x/V_x$ versus different differential input voltages (i.e., $V_s$ on X-axis). It should be noted that in FIG. 5 the center line 501 represents a value of $V_s=0$ volts. The gain-expanded input (noted by "$V_x$") at the gate of the FET 124 is converted to an output current ($i_3$) by "$g_{m3}$". The output current $i_3$ runs through the load 112 on the negative side of the differential output.

Figure 6:
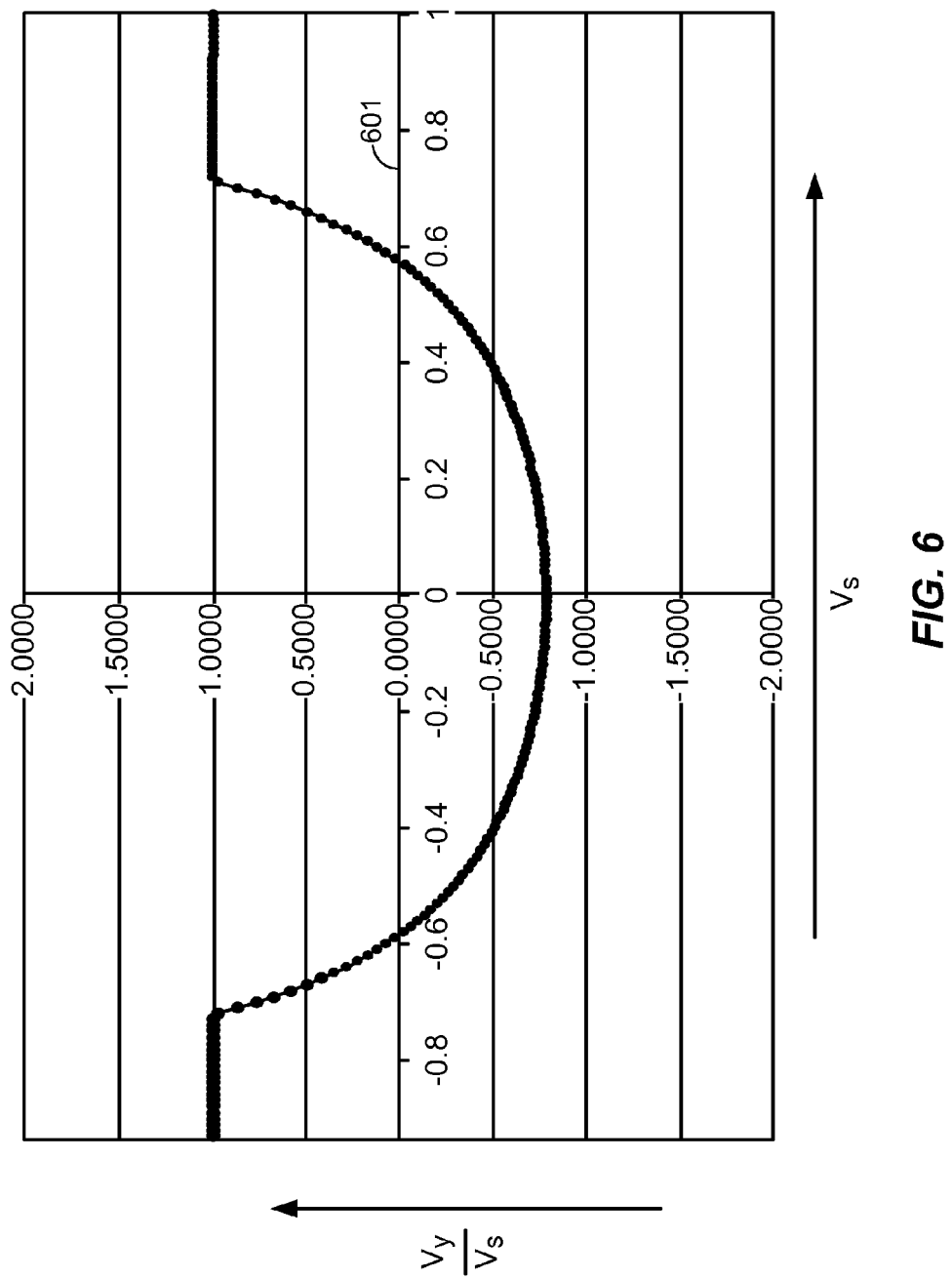
FIG. 6 shows the gain at the output of the broadband matching device as a function of the input voltage $V_s$ swing.

The voltage at the drain of the FET 114 "$V_y$," is converted to an output current ($i_2$) by "$g_{m2}$". That portion of the output current $i_2$ that is generated by the signal 119 (see FIG. 1) has an opposite phase with respect to the signal 117 (see FIG. 1) at "$V_x$". FIG. 6 shows the gain ($V_y/V_s$) of the FET 106 (see FIG. 1) for varying values of $V_s$. It should be noted that the horizontal line 601 is zero gain. Accordingly, the gain for the center of the curve is negative (i.e., the phase is opposite to the signal 117). In contrast, the gain shown in FIG. 5 is all positive.

In contrast to $i_3$, the output current $i_2$ runs through the load 110 on the positive side of the differential output. Accordingly, the impact of $i_3$ on the differential output is subtracted from the impact of $i_2$ on the differential output. The currents, $i_2$ and $i_3$, can be scaled individually by sizing them to control the "curvature" of the current vs. voltage (I-V) curve such that when they are combined at the output, the difference "$i_2-i_3$" is flat across a broad input voltage swing.

Figure 7:
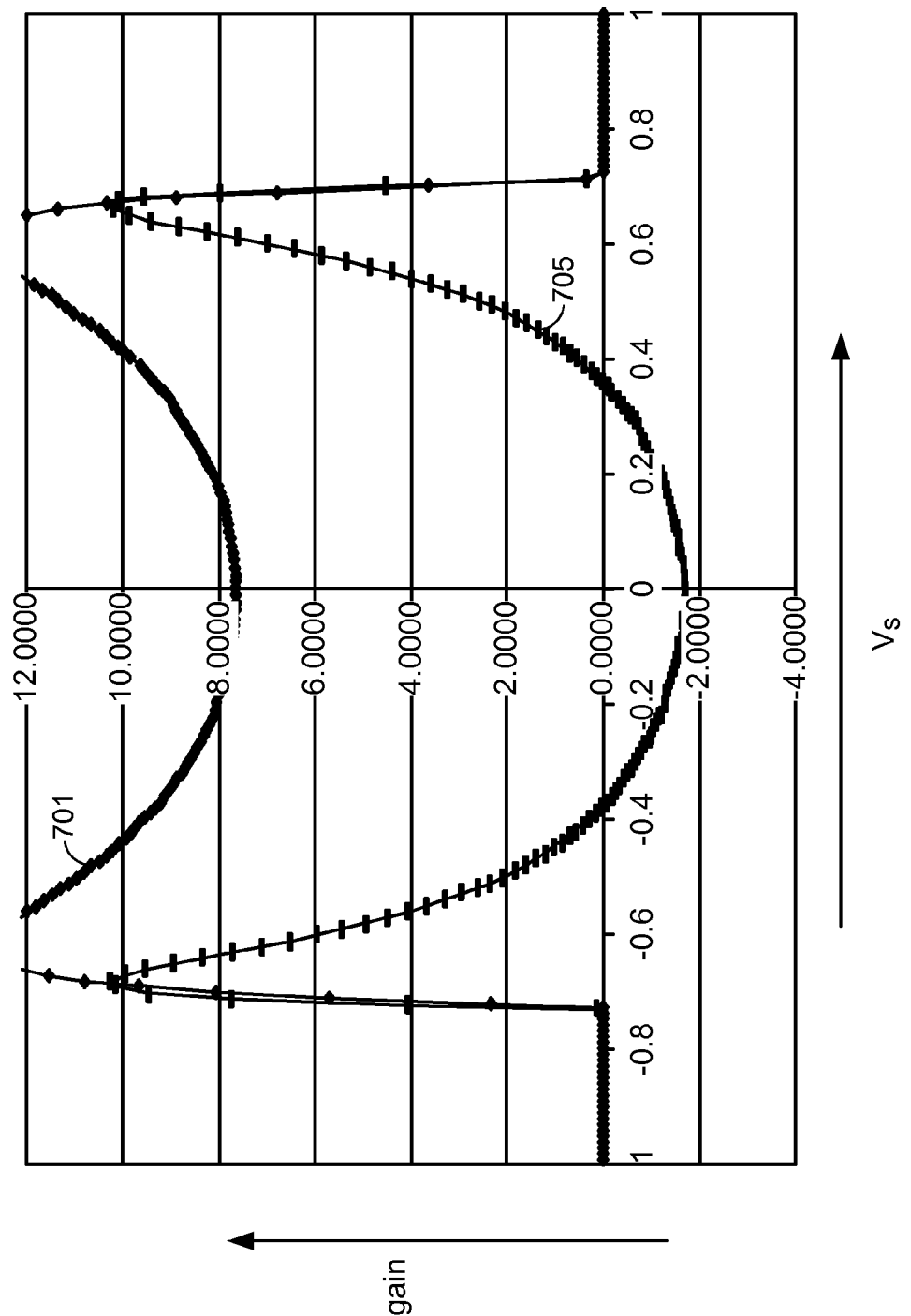
FIG. 7 shows a first curve of the gain of the two stages of the amplifier (i.e., the gain expansion, the gain of the first stage due to $g_{m1}$ and the gain of the second stage due to $g_{m2}$) and a second curve is 705 is that represents the combination of the gain expansion and $g_{m3}$.

FIG. 7 shows a first curve 705 of the gain of the two stages of the amplifier (i.e., the gain expansion, the gain of the first stage due to $g_{m1}$ and the gain of the second stage due to $g_{m2}$). In addition, a second curve is 701 is shown which represents the combination of the gain expansion and $g_{m3}$. In each case, the curves 701, 705 are shown with $V_s$ plotted along the x-axis.

Figure 8:
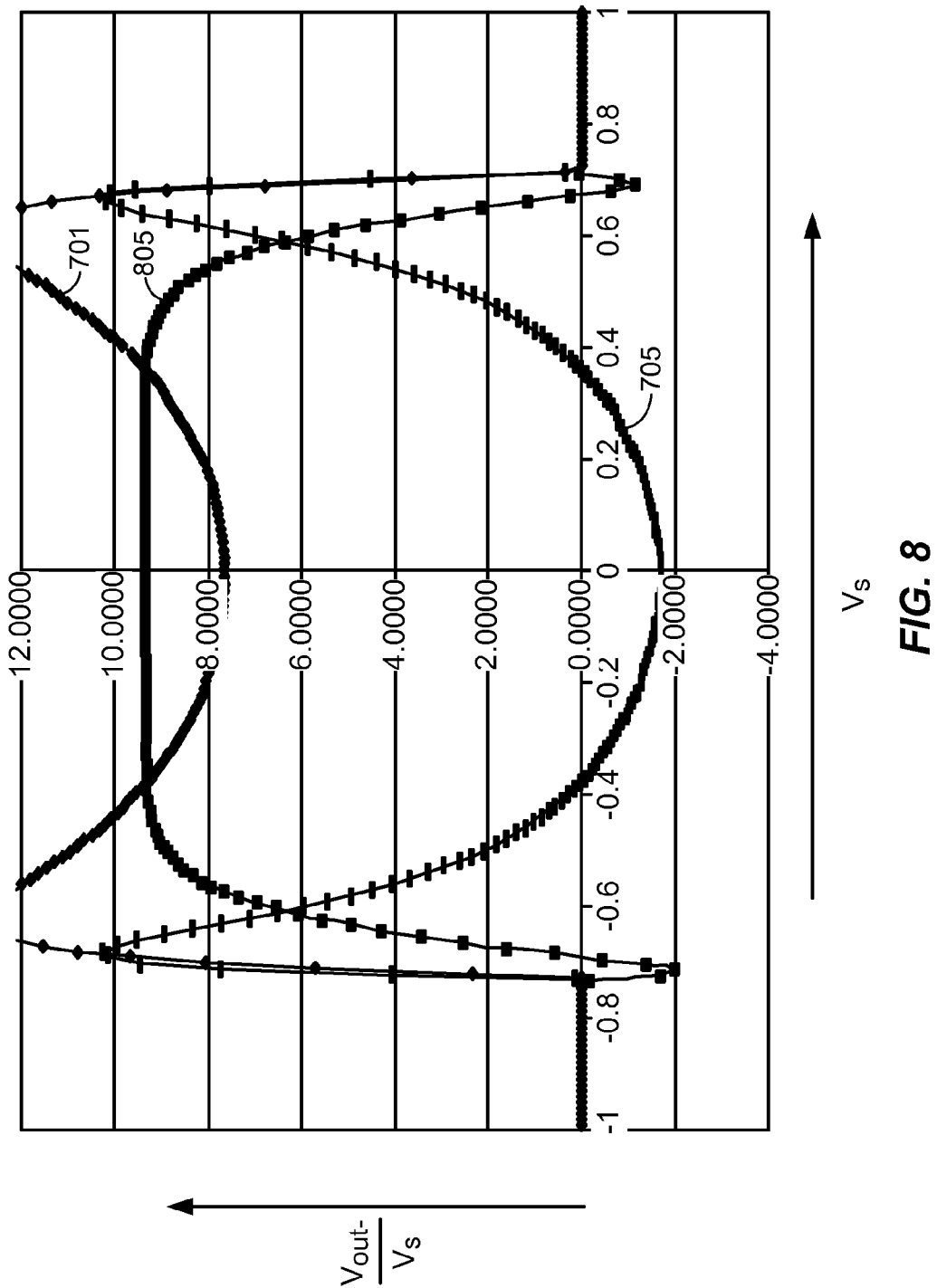
FIG. 8 shows the two gain curves of FIG. 7 and the combination of these two curves as detected by one of the two loads across the differential outputs.

FIG. 8 shows the two gain curves 701, 705 of FIG. 7, respectively, and the combination of these two curves 805 as detected by a load across the differential inputs. The result of the combination effectively obtains a flat combined "$G_m$" across a broader input range with this circuit for complying with a high linearity requirement.

Another way of understanding this circuit is to think of it as implementing pre-distortion, non-linearity cancellation. This differs from a traditional pre-distortion scheme in that the "$g_m$'s" between the three devices 114, 106, 124 are well-matched over variations in the manufacture process and over temperature. This is possible since all of the transistors 114, 106, 124 are of the same type. In one embodiment, the two "$g_m$-devices" 106, 108 are multiples of the "diode-connected device" 114. In this way, the non-linearity cancellation is maintained over variations in process and temperature. Furthermore, in one embodiment of the disclosed method and apparatus, the counter-balancing effects of variations in "$g_m$" of the "diode-connected device" 114 partially cancel out the gain variation due to variations in $g_m$ over process and temperature. That is, when the "gm" of the FET 114 increases either due to variations in the process or the temperature, $V_x$ will be decreased by the mechanism described above. Accordingly, this circuit topology is less process and temperature dependent, even without manipulating the biasing current.

Figure 9:
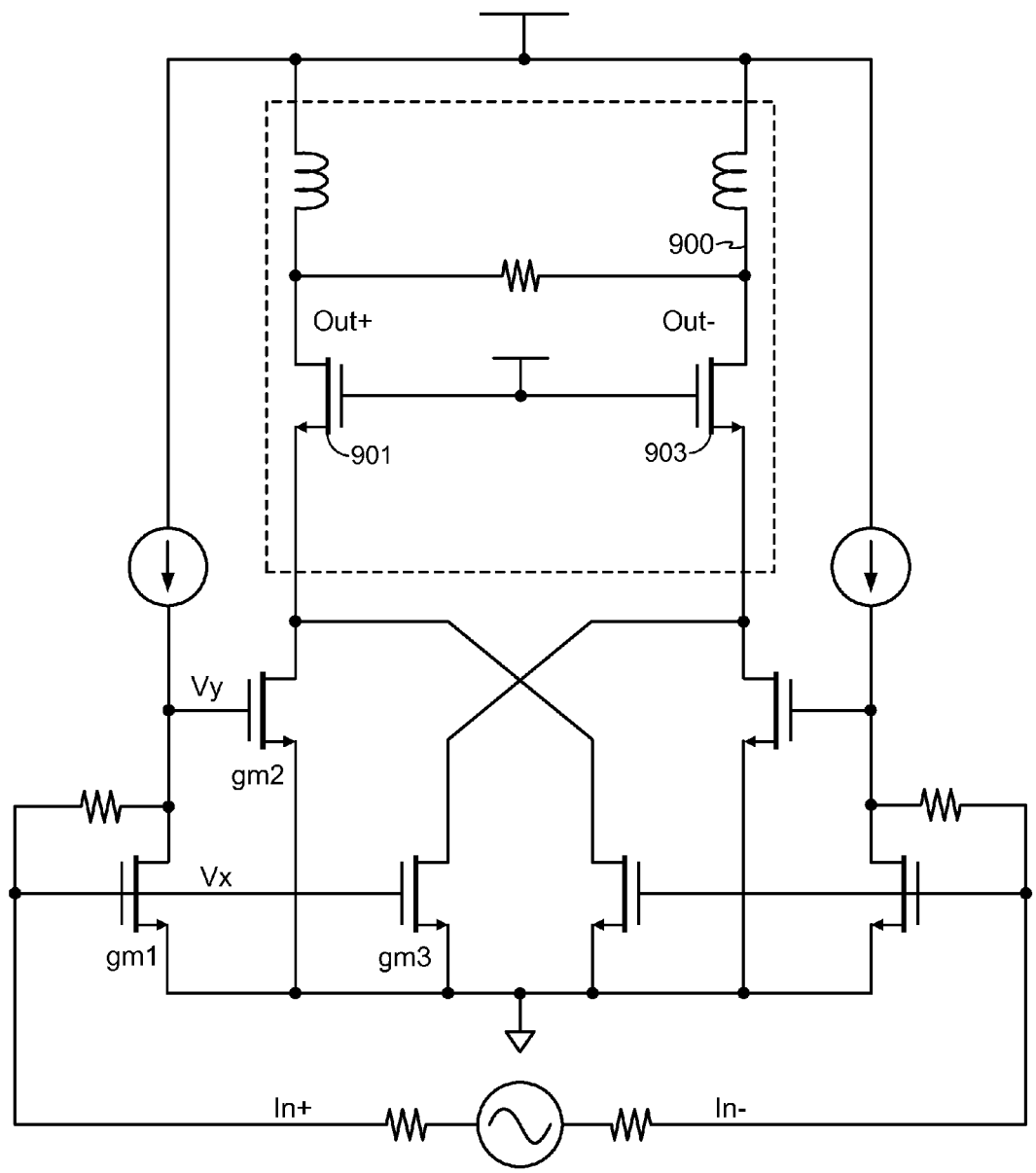
FIG. 9 shows one embodiment of the presently disclosed method and apparatus connected to a common gate stage that forms a differential cascode design.

The above circuit can be used in any general amplifier application that requires broadband input matching, low noise figure, high linearity and low gain variation. In power amplifier applications in which there is a high output swing (i.e., large variation in the voltage levels of $V_s$ causing a high voltage stress) or in any circuit requiring high reverse isolation, the outputs can be connected as shown in FIG. 9. FIG. 9 illustrates one embodiment of the disclosed apparatus in which load structure 900 comprises a common gate stage having two FETs 901, 903 to form a differential cascode design. Any non-linearity introduced by the added common gate stage is cancelled by over/under compensating the input gain expansion.

In one embodiment, the signal from the gate and/or the drain to the next $G_m$ stages is coupled either by means of direct DC coupling (as shown in FIG. 1 and FIG. 9) in which the biasing scheme is simplified. In an alternative embodiment, AC coupling is used such that capacitors decouple DC biasing between stages to optimize the cancellation of any non-linearity.

An additional advantage of the disclosed method and apparatus shown in FIGS. 1 and 9 is the inherent common-mode rejection that is provided. That is, the disclosed circuit provides inherent improved common-mode rejection, which is especially useful for a power amplifier. Such common-mode rejection is useful because it is essential to have tight voltage supply headroom in order to achieve the maximum drain-efficiency.

The Common-mode Rejection is defined as G_diff/G_comm=[gm2*(1−gm1*Rf)−gm3]/[gm2*(1−gm1*Rf)+gm3]. From this equation, it can be seen that the magnitude (i.e., absolute value) of the common mode rejection is greater than 1 (>0 dB Common-mode Rejection) when (1−gm1*Rf) is smaller than zero. Furthermore, (1−gm1*Rf) will always be smaller than zero in order to take advantage of the noise and linearity cancellation properties of the circuit.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

I claim:

1. A circuit comprising:

a) a first diode connected field effect transistor (FET) having a source, drain and gate and a resistor coupled between the drain and gate, the gate receiving a signal from a positive signal source;

b) a second FET having a source, drain and gate, the gate of the second FET coupled to the gate of the first diode connected FET and the source of the second FET coupled to the source of the first diode connected FET;

c) a third FET having a source, drain and gate, the gate of the third FET being coupled to the drain of the first diode connected FET and the source of the third FET being coupled to the source of the first diode connected FET;

d) a first constant current source coupled between the drain of the first diode connected FET and a power source;

e) a load structure having at least a first, second and third terminal, the first terminal coupled to the drain of the third FET and the second terminal coupled to the power source;

f) a fourth FET having a drain, source and gate, the drain of the fourth FET being coupled to the third terminal of the load structure, the source of the fourth FET coupled to the source of the first FET;

g) a fifth FET having a drain, source and gate, the drain of the fifth FET coupled to the drain of the third FET and the source of the fifth FET coupled to the source of the first FET;

h) a sixth FET having a source, drain and gate, the source of the sixth FET coupled source of the first FET, the drain of the sixth FET coupled to the gate of the fourth FET, and the gate of the sixth FET coupled to the gate of the fifth FET, the gate of the sixth FET receiving a signal from a negative signal source;

i) a second constant current source having a first and second terminal, the first terminal of the second constant current source coupled to the drain of the sixth FET and the second terminal of the second constant current source coupled to the second terminal of the load structure; and j) a resistor coupled between the gate of the sixth FET and the drain of the sixth FET.

* * * * *